United States Patent [19]

Wahl

[11] Patent Number: 5,625,314

[45] Date of Patent: Apr. 29, 1997

[54] SELF-CALIBRATING MULTIPLEXER CIRCUIT

[75] Inventor: Chris P. Wahl, North Huntingdon, Pa.

[73] Assignee: The United States of America as represented by the United States Department of Energy, Washington, D.C.

[21] Appl. No.: 499,886

[22] Filed: Jul. 11, 1995

[51] Int. Cl.$^6$ .................................................. G01R 31/30
[52] U.S. Cl. ........................ 327/519; 395/183.01; 371/28; 327/99
[58] Field of Search ................. 327/519, 99; 395/183.01, 395/183.16, 183.17, 183.19; 371/28; 370/112

[56] References Cited

U.S. PATENT DOCUMENTS

| | | | |
|---|---|---|---|
| 4,195,769 | 4/1980 | Elias et al. | 371/20 |
| 5,001,712 | 3/1991 | Splett et al. | 371/3 |
| 5,535,216 | 7/1996 | Goldman et al. | 370/112 |

*Primary Examiner*—Timothy P. Callahan
*Assistant Examiner*—Jung Ho Kim
*Attorney, Agent, or Firm*—Virginia B. Caress; William R. Moser; Paul A. Gottlieb

[57] ABSTRACT

A time domain multiplexer system with automatic determination of acceptable multiplexer output limits, error determination, or correction is comprised of a time domain multiplexer, a computer, a constant current source capable of at least three distinct current levels, and two series resistances employed for calibration and testing. A two point linear calibration curve defining acceptable multiplexer voltage limits may be defined by the computer by determining the voltage output of the multiplexer to very accurately known input signals developed from predetermined current levels across the series resistances. Drift in the multiplexer may be detected by the computer when the output voltage limits, expected during normal operation, are exceeded, or the relationship defined by the calibration curve is invalidated.

16 Claims, 3 Drawing Sheets

SELF-CALIBRATING MULTIPLEXER CIRCUIT

BACKGROUND OF THE INVENTION

1. Field of the Invention

The present invention relates generally to electronic circuits for error detection and more particularly to an electronic circuit for continuous testing and quantification of inaccuracies in time domain multiplexer circuits.

2. Description of the Prior Art

Conventional multiplexer circuits are not radiation hardened and are most often in integrated form. It is known that conventional multiplexer circuit operations are likely to be adversely affected in terms of errors when placed in severe environments such as unusually high temperature or radiation flux. For this reason, radiation hardened integrated multiplexer circuits are typically used for such applications.

There are two main detractors to the use of radiation hardened multiplexers and radiation hardened electronics in general, namely cost and availability. Radiation hardened electronics are an order of magnitude more costly than military electronics, which are considerably more expensive then conventional electronics. Additionally, there does not exist the variety nor the long-term availability of radiation hardened electronics compared to conventional electronics.

Therefore, should the means to allow the use of non-radiation hardened electronics in those applications where radiation hardened electronics are currently deemed necessary, be developed, considerable cost savings, and possibly greater functionality due to a larger variety of components, may be achieved. To further increase cost savings and reliability, while decreasing complexity, any such means would normally possess a minimal of additional hardware.

In that drift would be expected of a non-radiation hardened multiplexer in severe environments, a method of constant monitoring would be necessary to determine and quantify the extent of drift occurring at any given time. The term "drift" for the purposes of this patent application will refer to any situation where the output of the multiplexer fails to remain an accurate representation of the voltage at the multiplexer's input. Further, should the drift exceed acceptable limits, means for appropriate compensation or possibly simple data adjustment could be of considerable value. While circuitry exists to monitor the output of time domain multiplexers, specifically by time-domain-reflectometry, such systems do not have the means to monitor the input to output path of the selected detector signals nor do they have the ability to compensate for drift once detected.

SUMMARY OF THE INVENTION

It is therefore an object of the present invention to provide an electronic circuit for continuous testing of a time domain multiplexer integrated circuit.

A further object of this invention is to provide an electronic circuit for continuous testing of a time domain multiplexer integrated circuit wherein both the input and output paths to the multiplexer are monitored to detect for inaccurate or undesirable circuit operations.

It is another object of this invention to provide continuous testing means for a time domain multiplexer integrated circuit without requiring any additional hardware at the site of the integrated circuit.

It is yet another object of this invention to provide an electronic circuit for continuous testing of time domain multiplexing circuits in severe environments without requiring radiation hardened components.

It is still a further object of the present invention to provide continuous testing means, for time domain multiplexing integrated circuits, which may be constructed of reduced cost components.

It is yet a further object of this invention to provide an electronic circuit for continuous testing of time domain multiplexer circuits which could easily facilitate error compensation means.

Briefly, these and other objects may be achieved by a system comprised of a highly stable current source capable of outputting three or more current levels, a multiplexer, and a computer which includes means to control source current level and determine the multiplexer's response to very accurately known input signals.

BRIEF DESCRIPTION OF THE DRAWING

The invention will be further described in conjunction with the accompanying drawings, in which.

DETAILED DESCRIPTION OF THE PREFERRED EMBODIMENT

Figure 1:
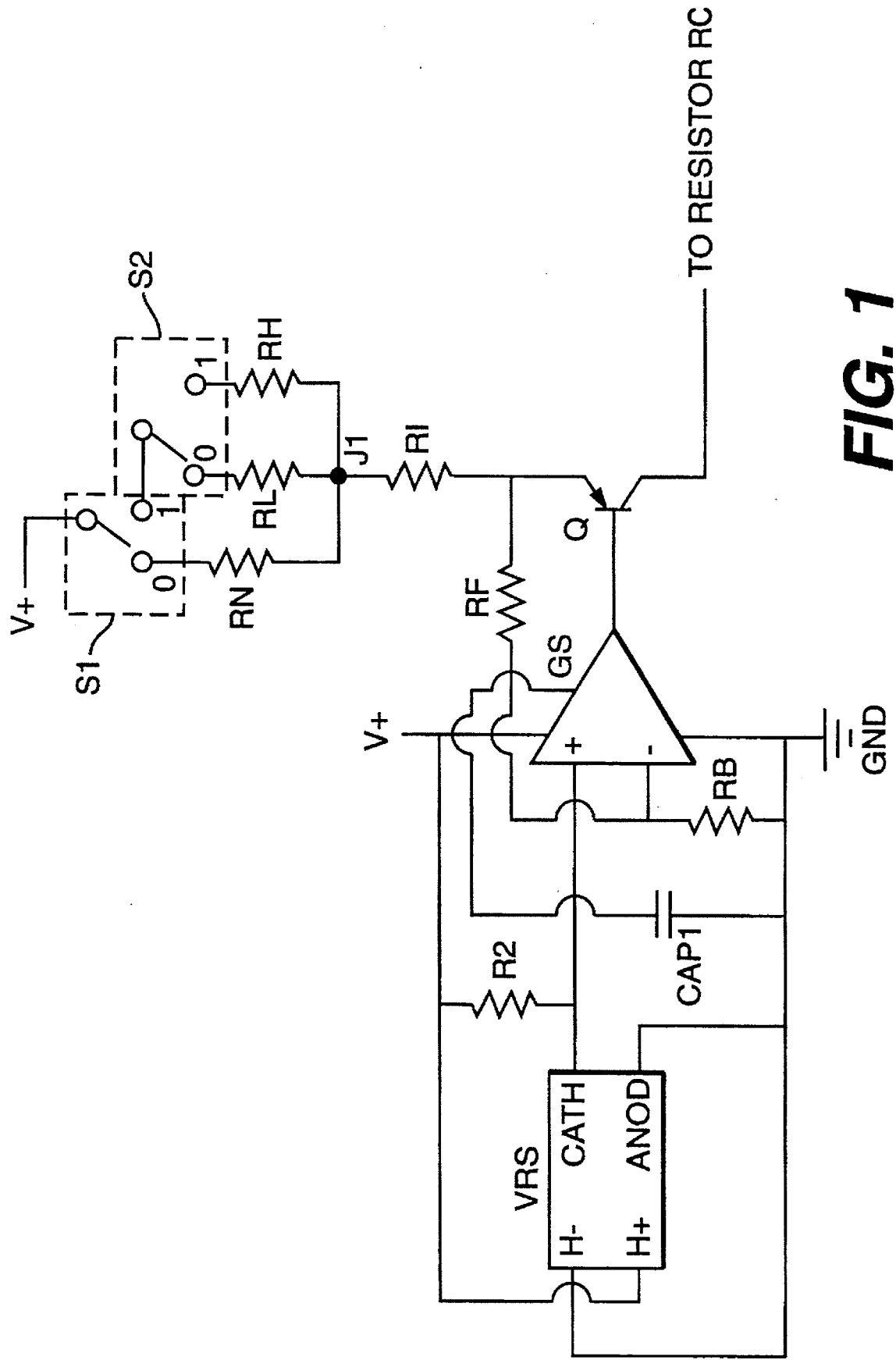
FIG. 1 is a schematic of one possible configuration of a highly stable current source capable of at least three different current levels.

With reference to the figures, wherein like reference characters indicate like elements throughout the several figures and, in particular, with reference to FIG. 1, a constant current source circuit is depicted which is capable of generating at least three different output current levels. Two switches, S1 and S2, are depicted as analog, single-pole, double-throw type but may be an electronic equivalent when employed with the instant invention. One output path of S1 is connected to resistor RN which in turn terminates at junction J1. The offer output path of S1 is connected to the pole of S2. One output path of S2 is connected to resistor RL which terminates at junction J1. The other output path of S2 is connected to resistor RH which terminates at junction J1 as well. A resistor R1 is connected to junction J1 at one side, and the other side of R1 is connected to the emitter of P-N-P transistor Q. A voltage reference source VRS is connected to the; non-inverting input stage of an operational amplifier gain stage GS which, in turn, provides a low impedance non-inverting output to the base of transistor Q. As depicted, selection of resistances RN, RL or RH determines the current level, thereby allowing for at least three distinct current levels. This particular configuration constitutes one possible constant current source design. It is important to note, however, that while it is necessary that the constant current source be highly stable and capable of at least three different desired current output levels, the particular design of a viable current source may be varied.

Figure 2:
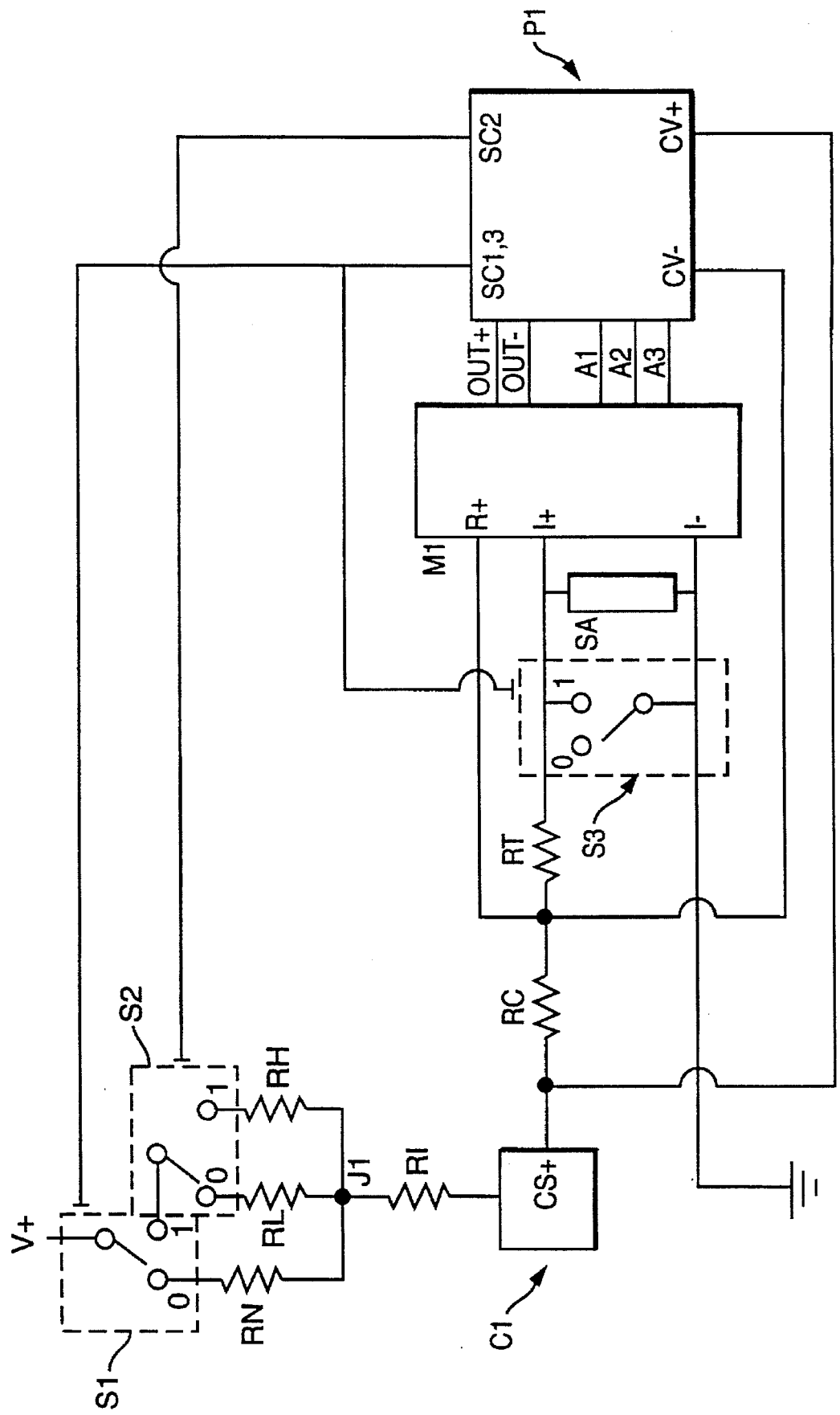
FIG. 2 is a schematic and block diagram depiction of an electronic circuit for continuous testing of time domain multiplexer integrated circuits and is constructed in accordance with a preferred embodiment of the invention.

Referring now to FIG. 2, in which an electronic circuit for continuous testing of time domain multiplexer circuits is shown, the previously described constant current source is now depicted as a single block C1. The collector side of Q, in FIG. 1, is depicted here as the output of current source C1 at CS+. This output is connected to resistor RC, which in turn is connected in series with resistor RT. Resistor RT is connected to the positive input of multiplexer M1 at I+. Input R+ of multiplexer M1 is connected between RC and RT. It is further understood that switches S1 and S2 are configured and function as previously described. The circuit further consists of switch S3, sensor array SA, time domain multiplexer M1, and computer processor P1. One function of the computer P1 is to control the switching operations of switches S1, S2, and S3. Switch S3 is depicted as an analog, single-pole, single-throw type but may be an electronic equivalent. It is placed in parallel with sensor array SA which is comprised of series, temperature dependent resistances which determine the input voltages to M1. The remaining connections between SA and M1 are not shown here, but will be further explained in reference to FIG. 3. Another function of the computer P1 is to control the addressing of the time domain multiplexer integrated circuit, M1. The addressing connections between P1 and M1 are shown in FIG. 2 as A1, A2, and A3. The computer P1 also incorporates means for retrieving multiplexer, M1, outputs depicted as OUT+ and OUT–. Also received by computer P1 is the voltage across resistor RC at terminals CV+ and CV–. Computer P1 may also include means, via firmware or software, to compensate for drift, or to give notification that drift has occurred. Notification may be provided by an audible or visual indicator.

Figure 3:
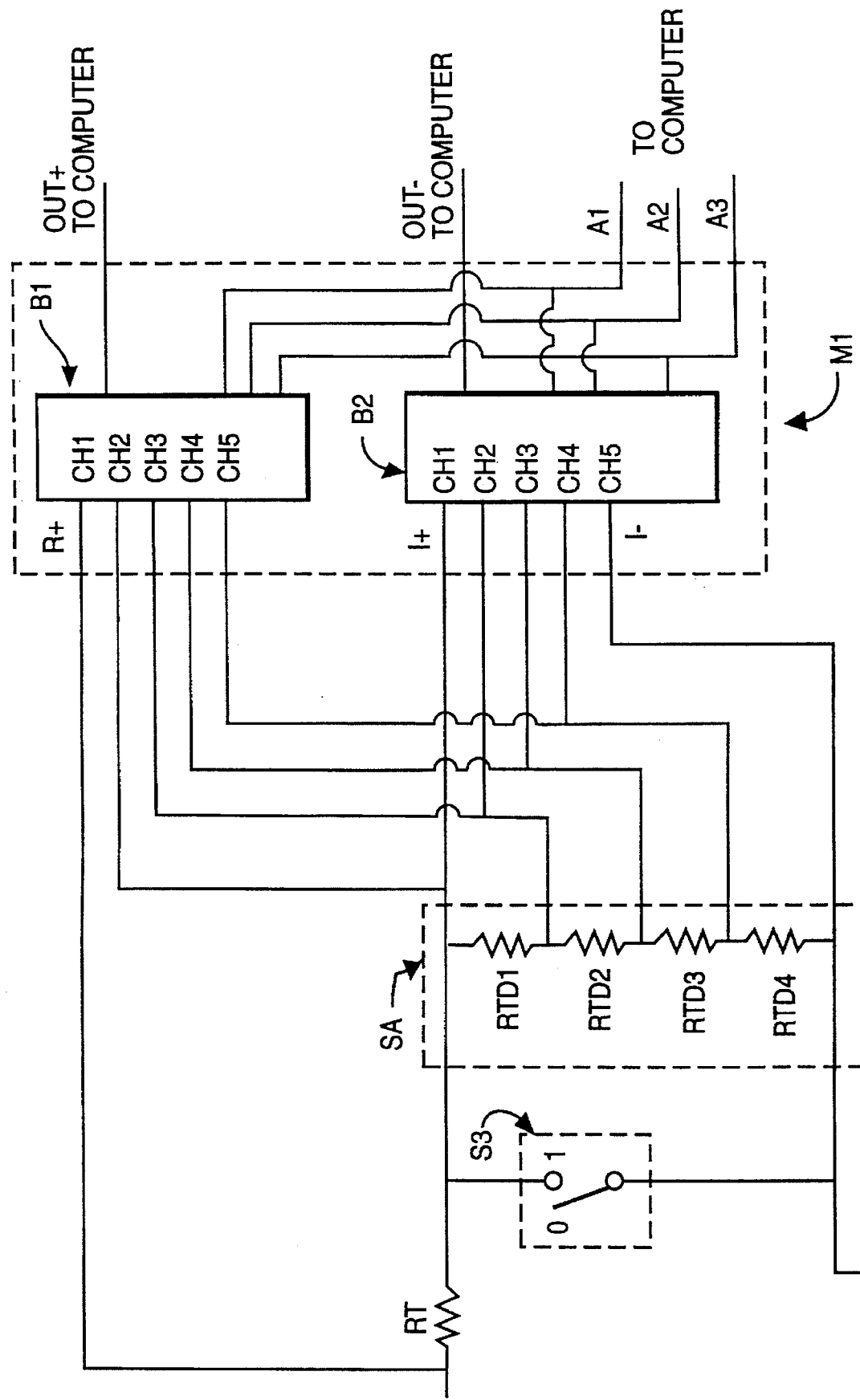
FIG. 3 is one possible configuration of a time domain multiplexer circuit, with inputs from series resistive sensors and is constructed in accordance with a preferred embodiment of the invention.

Referring now to FIG. 3, in which the interconnections between sensor array, SA, and multiplexer M1 are shown, four temperature dependent resistors in series configuration, RTD1, RTD2, RTD3, and RTD4 are depicted which, in accordance with the instant invention, make up sensor array SA. It should be understood that any number of resistances could be implemented. Also shown is resistor RT, switch S3, and two banks, B1 and B2, of multiplexer M1. Addressing connections, A1, A2, and A3 are depicted as being connected in a parallel fashion to B1 and B2, which causes a single address code to address channels in both B1 and B2, simultaneously. For example, if channel CH2 is addressed, the voltage at one end of RTD1 is outputted by B1 at OUT+, and the voltage at the other side of RTD1 is outputted by B2 at OUT–. The difference of these voltages is equal to the voltage drop across RTD1. It should be apparent that when switch S3 is closed, the resistors RTD1, RTD2, RTD3, and RTD4 are short-circuited. Resistor RT, however, has not been short-circuited. The voltage across RT may be outputted by multiplexer banks B1 and B2 by addressing CH1.

The significance of each component in the figures will be made clear by the explanation to follow of the overall circuit functions. FIG. 2 provides the best aid in contemplating the following explanation.

Because the operations of the circuit of the instant invention are repetitive in nature, the explanation to follow must assume the conditions of an arbitrary starting point. For that reason, Switch S3 will be assumed to be driven by the higher of two possible voltages by computer P1 which causes S3 to be closed thereby shorting the sensor array SA. Switch S1 will be assumed to be driven at the higher of two possible voltage levels by computer P1, thereby removing RN from the current source's circuitry and providing a virtually unimpeded conductive path to the pole of switch S2, and switch S2 will be assumed to be driven by the higher of two possible voltage levels by computer P1 which places RH into the current source's circuitry.

Starting from the above mentioned conditions, computer P1 drives output terminal SC1,3 to the lower of two possible voltage output levels which causes switch S1 to place resistor RN into the current source circuit and simultaneously causes switch S3 to open, thereby removing the short circuit over multiplexer M1 inputs allowing the current to flow through sensor array SA. Resistor RN is chosen such that the current level output is that which generates the desired voltages across sensor array SA resistances monitored by multiplexer M1. At this point, multiplexer M1 is operating normally. Computer P1 inputs the voltages at CV+ and CV– and determines the difference which is equal to the voltage drop over resistor RC. Resistor RC is specified as a 0.01% metal film or better. With this voltage and the value of resistor RC, computer P1 may then determine the output current level of C1 with RN in the current source circuit with a high degree of precision. It should be recognized that the current level may be determined to a greater accuracy as the resistor's, RC, value is known to a greater accuracy.

The following is a description of the circuit operating in test mode. That is, the accuracy of the multiplexer is quantified by first establishing a two point linear calibration curve which is determined by the response of the multiplexer to very accurately known input signals.

Computer P1 now drives SC1,3 to the higher voltage which causes switch S1 to remove RN from current source circuit C1. Switch S3 is closed simultaneously which short circuits the non-test resistances RTD1, RTD2, RTD3 and RTD4 of which SA is comprised. It is important to recognize that when S3 is closed, the only voltage appearing at multiplexer M1 inputs, particularly R+ and I+, is that across RT. Resistor RT is also specified as a 0.01% metal film or better.

Computer P1 drives SC2 with the lower voltage which places RL into the current source's circuitry. Resistor RL is of a value which is chosen such that the resultant current level output by C1 will generate a voltage across RT, that is the lowest voltage that could be expected to develop across any of the non-test resistances of which SA is comprised while operating under normal conditions. By "normal conditions" it is meant that sensor array SA is operating in an environment, under the conditions for which it is intended while being driven by a current level which has been chosen for the non-test function of the circuit, measuring one of RTD1–RTD4, and in that case, RN is placed in current source circuit C1 as earlier described.

Computer P1 inputs the voltage across RC as previously described to accurately calculate the current level, $I_L$, which is output by C1 when RL in the current source circuit. Computer P1 now addresses the inputs to which resistance RT is connected via multiplexer M1 and inputs the voltage output by M1 at OUT+ and OUT–, the difference of which is the voltage drop across RT, which is as low as any voltage ever expected to be developed across any input resistance of which SA is comprised, while operating under normal conditions. This voltage will be referred to as $V_L$. Again, RT is the only addressable resistance while S3 is closed. $I_L$ and $V_L$ may now be utilized by the computer to establish the lower limit of a two point linear calibration curve. The following section describes how the upper limit may be obtained in a similar fashion.

Computer P1 now drives SC2 with the higher voltage which places RH in the current source circuit. In doing so, a new output level is produced such that the voltage across RT is the highest that could be expected to develop across any of the non-test resistances of which SA is comprised while operating under normal conditions. Again P1 inputs the voltage across RC as previously described to accurately calculate the current level, $I_H$, which is output by C1 while RH is in the current source circuit. Computer P1 now addresses the input to which RT is connected via multiplexer M1 and inputs the voltage output of M1 appearing at OUT+ and OUT−, the difference of which is the voltage drop over RT. This voltage will be referred to as $V_H$. This data may be utilized to establish the upper limit of a two point linear calibration curve.

At this point, computer P1 drives SC1.3 low as was previously described. All operations are repeated as explained above, thereby starting another calibration cycle. Each cycle produces two calibration points, ($I_L$, $V_L$) and ($I_H$, $V_H$), which is the determination of multiplexer M1's response in voltage to very accurately known input signals. Specifically, the input signals are those which are the highest and lowest which are expected to be experienced by multiplexer M1 while operating under normal conditions. Should computer P1 input a voltage which is outside the bounds of the previously established calibration points, a means to provide notification may be utilized. Also, because the current level and the resulting voltage output of multiplexer M1 is known, as well as the relationship thereof, it may then be possible to identify either the current source C1, multiplexer M1, or both as the cause of the error or drift. Further, means to adjust the input current C1, the voltage output of multiplexer M1, or data in a data base could be implemented in response to drift.

While this discussion has been generally concerned with the use of non-radiation hardened multiplexers in high temperature or radiation flux environments, it should be clear that the instant invention contemplates the quantification of the extremes of acceptable error in any multiplexer regardless of the cause of error, and the use of the invention could be meaningful in many applications outside of the high temperature or radiation flux environments.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A time domain multiplexer system with automatic error determination, comprising:

constant current source means for generating at least three distinct predetermined current output levels;

a time domain multiplexer;

a computing means;

two series resistances of predetermined magnitude;

one end of said series resistances being connected to, and driven by, said constant current source means, the other end of said series resistances being connected to said multiplexer at an input;

said multiplexer, said current source means, and said computing means being interconnected, said computing means controlling an output from said multiplexer with said multiplexer outputs being inputted to said computing means;

said computing means also selecting a current level of said at least three output levels for said current source means; the current at a first level being employed to energize sensors for normal multiplexer operations, the currents at second and third levels being employed to develop second and third voltages across each of said two series resistances, said second and third voltages across one of said resistances being inputted to said computing means to determine the magnitude of said second and third current levels, said second and third voltages across said second of said series resistances being inputted to said multiplexer, outputted from said multiplexer, and inputted to said computing means; and said computing means, employing said inputted voltages, for determining acceptable limits of voltage output from said multiplexer during normal multiplexer operation.

2. The time domain multiplexer system of claim 1 wherein said constant current source means comprises a voltage reference, a non-inverting operational amplifier gain stage, and a bipolar transistor, said voltage reference source being connected to the non-inverting input of said operational amplifier, and an output of said operational amplifier being connected to a base of said bi-polar transistor.

3. The time domain multiplexer system of claim 2 wherein said operational amplifier gain stage includes a resistor connected between an emitter of said bi-polar transistor and an inverting input of said operational amplifier.

4. The time domain multiplexer system of claim 2 wherein an output of said constant current source means is taken from a collector of said bi-polar transistor.

5. The time domain multiplexer system of claim 1 wherein said sensors energized for normal multiplexer operations are a plurality of resistive sensors connected in series, said sensors being energized by said current at said first level.

6. The time domain multiplexer system of claim 5 wherein said series connected sensors are shorted when said current source means is at said second and third levels.

7. The time domain multiplexer system of claim 5 wherein a voltage across each of said sensors is indicative of sensor conditions.

8. The time domain multiplexer system of claim 5 wherein said multiplexer is comprised of two multiplexer circuits, one for receiving a higher voltage across each of said sensors, the other for receiving a lower voltage across each of said sensors, said computing means controlling outputting of said high and low voltage from each of said sensors at the same time.

9. The time domain multiplexer system of claim 5 wherein said computing means receives said high and low voltage outputs from said sensors, calculates the voltage across each sensor and determines a condition of each of said sensors.

10. A time domain multiplexer system with automatic error determination, comprising:

constant current source means for generating at least three distinct predetermined current output levels, said constant current source means comprising a voltage reference, a non-inverting operational amplifier gain stage, and a bipolar transistor, said voltage reference source being connected to the non-inverting input of said operational amplifier, and an output of said operational amplifier being connected to a base of said bi-polar transistor;

a time domain multiplexer;

a computing means;

two series resistances of predetermined magnitude;

one end of said series resistances being connected to, and driven by, said constant current source means, the other end of said series resistances being connected to said multiplexer at an input;

said multiplexer, said current source means, and said computing means being interconnected, said computing means controlling an output from said multiplexer with said multiplexer outputs being inputted to said computing means;

said computing means also selecting a current level of said at least three output levels for said current source means; the current at a first level being employed to energize sensors for normal multiplexer operations, the currents at second and third levels being employed to develop second and third voltages across each of said two series resistances, said second and third voltages across one of said resistances being inputted to said computing means to determine the magnitude of said second and third current levels, said second and third voltages across said second of said series resistances being inputted to said multiplexer, outputted from said multiplexer, and inputted to said computing means;

said computing means, employing said inputted voltages, for determining acceptable limits of voltage output from said multiplexer during normal multiplexer operation; and said sensors energized for normal multiplexer operations are a plurality of resistive sensors connected in series, said sensors being energized by said current at said first level.

11. The time domain multiplexer system of claim 10 wherein said operational amplifier gain stage includes a resistor connected between an emitter of said bi-polar transistor and an inverting input of said operational amplifier.

12. The time domain multiplexer system of claim 10 wherein an output of said constant current source means is taken from a collector of said bi-polar transistor.

13. The time domain multiplexer system of claim 10 wherein said series connected sensors are shorted when said current source means is at said second and third levels.

14. The time domain multiplexer system of claim 10 wherein a voltage across each of said sensors is indicative of sensor conditions.

15. The time domain multiplexer system of claim 10 wherein said multiplexer is comprised of two multiplexer circuits, one for receiving a higher voltage across each of said sensors, the other for receiving a lower voltage across each of said sensors, said computing means controlling outputting of said high and low voltage from each of said sensors at the same time.

16. The time domain multiplexer system of claim 15 wherein said computing means receives said high and low voltage outputs from said sensors, calculates the voltage across each sensor and determines a condition of each of said sensors.

* * * * *